United States Patent [19]

Ohya

[11] Patent Number: 5,162,881
[45] Date of Patent: Nov. 10, 1992

[54] DYNAMIC RANDOM ACCESS MEMORY DEVICE HAVING RAMPART STRUCTURE OUTSIDE MEMORY CELL ARRAY

[75] Inventor: Shuichi Ohya, Tokyo, Japan

[73] Assignee: NEC Corporation, Tokyo, Japan

[21] Appl. No.: 571,967

[22] Filed: Aug. 24, 1990

[30] Foreign Application Priority Data

Aug. 24, 1989 [JP] Japan .................................. 1-218197

[51] Int. Cl.[5] ...................... H01L 29/68; H01L 27/10; H01L 23/48; H01L 29/06
[52] U.S. Cl. ................................. 257/309; 257/634; 257/758
[58] Field of Search .................... 357/23.6, 45, 68, 71, 357/56

Primary Examiner—Mark V. Prenty
Attorney, Agent, or Firm—Sughrue, Mion, Zinn, Macpeak & Seas

[57] ABSTRACT

A semiconductor memory device is fabricated on a semiconductor substrate and comprises a memory cell array having a plurality of memory cells and located in a predetermined cell area of the semiconductor substrate, a rampart structure formed outside the memory cell array and having an outer wall gently sloping down, an upper insulating layer convering the memory cells and the rampart structure, and at least one wiring layer formed on the upper insulating layer and extending over at least one of the memory cells and the rampart structure, whereby the wiring layer is prevented from non-conformal step coverage and any disconnection.

11 Claims, 6 Drawing Sheets

DYNAMIC RANDOM ACCESS MEMORY DEVICE HAVING RAMPART STRUCTURE OUTSIDE MEMORY CELL ARRAY

FIELD OF THE INVENTION

This invention relates to a dynamic random access memory device and, more particularly, to a rampart structure provided outside the memory cell array for a conformal wiring layer extending over the memory cell array.

DESCRIPTION OF THE RELATED ART

Various stacked cells have been proposed for decreasing the occupation area of each memory cell, and a typical example is disclosed by Hirohiko Mochizuki et. al. in "A 70 ns 4 Mb DRAM in a 300 mil DIP using Layer Poly", 1987 IEEE International Solid State Circuit Conference, Digest of Technical Papers, page 284 and 285. Mochizuki et. al. discloses the structure of a three dimensional stacked cell where he first polysilicon layer, the second and third polysilicon layers and the fourth polysilicon layer serve the gate electrode coupled to the metal word line, the cell capacitor and the bit line, respectively.

Figure 1:
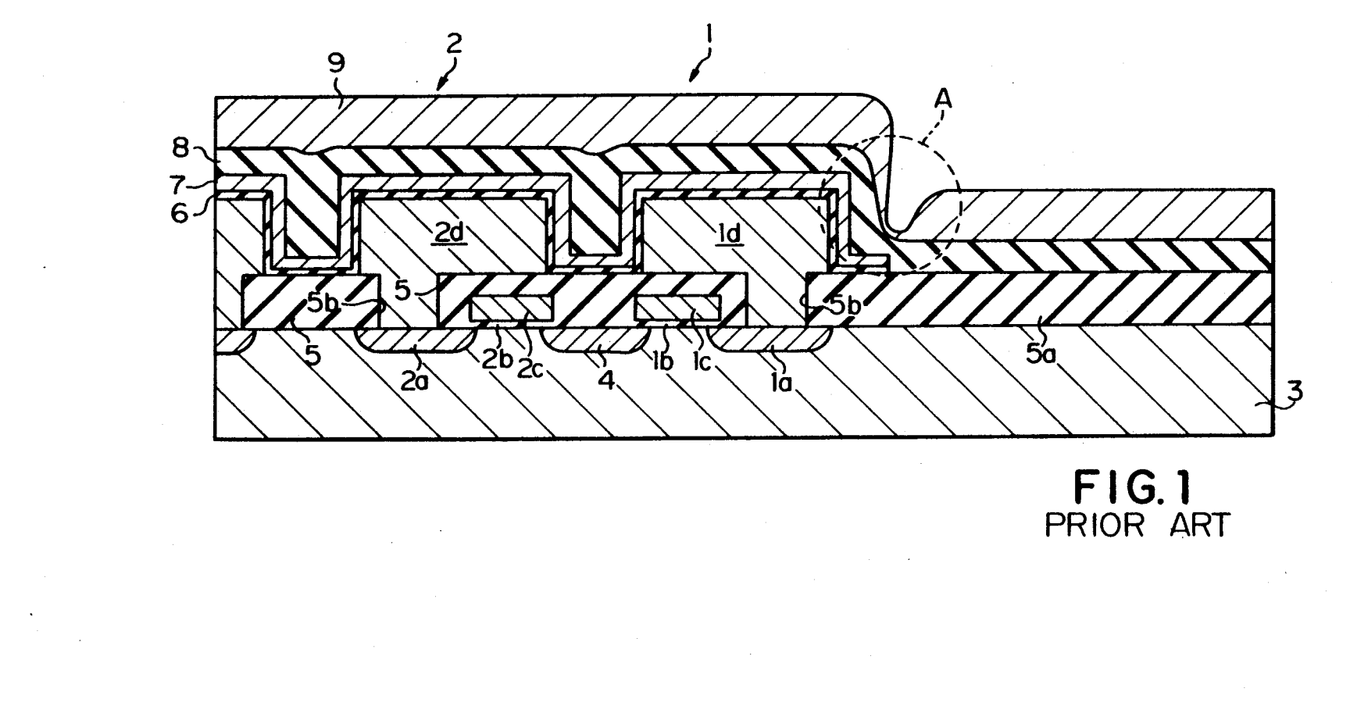
FIG. 1 is a cross sectional view showing the structure of a prior art random access memory device.

FIG. 1 shows a coupled of stacked memory cells 1 and 2 incorporated in another prior art dynamic random access memory device fabricated on a silicon substrate 3. In the surface portion of the silicon substrate 1 is formed three impurity regions one of which serves as a bit line 4 and the others of which provide respective memory nodes 1a and 2a of the memory cells 1 and 2. Over that area between the bit line 4 and the memory node 1a is grown a thin gate oxide film 1b which is overlain by a gate electrode 1c. The memory node 1a, the thin gate oxide film 1b and the gate electrode 1c form in combination a switching transistor of the stacked memory cell 1. Similarly, a thin gate oxide film 2b extends over the surface between the bit line 4 and the memory node 2a, and a gate electrode 2c is provided on the thin gate oxide film 2b so that a switching transistor is provided for the stacked memory cell 2. The gate electrodes 1c and 2c are covered with a thick insulating film 5, and contact holes 5a and 5b are formed in the thick insulating film 5, exposing the memory nodes 1a and 2a, respectively. Lower electrodes 1d and 2d are patterned on the thick insulating film 5 and respectively penetrate the contact holes 5a and 5b so as to be brought into contact with the memory nodes 1a and 2a, respectively.

Since the lower electrodes 1d and 2d are spaced apart from each other, a conformal thin dielectric film 6 extends partially on the surface of the lower electrode 1d, partially on the thick insulating film 5 and partially on the surface of the lower electrode 2d. Thus, the thin dielectric film 6 covers the entire surfaces of the lower electrodes 1d and 2d and isolate the lower electrodes 1d and 2d from one another. The thin dielectric film 6 is covered with an upper electrode 7 which is shared between the stacked memory cells 1 and 2. The lower electrode 1d, the thin dielectric film 6 and the upper electrode 8 form a storage capacitor of the stacked memory cell 1, and the lower electrode 2d, the dielectric film 6 and the upper electrode 7 as a whole constitute a storage capacitor of the stacked memory cell 2. The entire surface of the structure is covered with an insulating film 8, and an aluminum wiring 9 extends on the insulating film 8.

Assuming now that the dielectric film 6 is formed of a predetermined substance and that the thickness of the film 6 is constant, the capacitance of each storage capacitor depends on the amount of the surface of the lower electrode 1d or 2d. It is usual that an occupation area of each stacked memory cell is decreased with integration density, and the top surface of the storage capacitor follows the occupation area. However, it is possible to compensate the decrement of the top surface with increment of the side surface of the lower electrode 1d or 2d. This solution results in higher lower electrodes, and the higher lower electrodes are causative of non-conformal step-coverage of the aluminum wiring (as encircled with dash lines A in FIG. 1 or undesirable disconnection in an extreme case.

If a stacked memory cell array is designed with the minimum device dimension of 1 micron, the gap between the adjacent lower electrodes 1d and 2d is 1 micron. The height of each lower electrode 1d or 2d and the thickness of the upper electrode 7 are assumed to be 1 micron and 0.2 micron, respectively, and a slit as narrow as 0.6 micron takes place in the conformal upper electrode 7 between the adjacent lower electrodes 1d and 2d because the dielectric film 6 is negligible in thickness Such a narrow slit is easily filled with the insulating film 8 through a reflow process as long as the insulating film 8 is deposited to about 0.4 micron thick. However, if the stacked memory cell 1 is located at the periphery of the array, the insulating film 8 of the order of 0.4 micron thick hardly produces a smooth sloop over the vertical wall of about 1 micron high. This means that the insulating film 8 is also steep, and any conformal step coverage hardly takes place as encircled with the dash lines A.

The step coverage may be improved by increasing the insulating film 8 in thickness. However, the aluminum wiring 9 needs to contact with a lower level conductive portion such as an impurity region and is much liable to be disconnected while passing through a deep contact window formed in the thick insulating film 8. In other words, the thick insulating film 8 is not desirable from the aspect of an inter-level connection. Thus, there is a trade-off between the step coverage and the inter-level connection, and such disconnections deteriorate the production yield of the semiconductor memory device.

SUMMARY OF THE INVENTION

It is therefore an important object of the present invention to provide a random access memory device which is free from disconnections due to non-conformal step coverage and to deep contact window.

To accomplish the object, the present invention proposes to build up a rampart structure outside a memory cell array.

In accordance with the present invention, there is provided a semiconductor memory device fabricated on a semiconductor substrate having a predetermined cell area, comprising: a) a memory cell array having a plurality of memory cells and located in the predetermined cell area; b) a rampart structure formed outside the memory cell array and having an outer wall gently sloping down; c) an upper insulating layer covering the memory cells and the rampart structure; and d) at least one wiring layer formed on the upper insulating layer and extending over at least one of the memory cells and the rampart structure.

BRIEF DESCRIPTION OF THE DRAWINGS

The features and advantages of a random access memory device according to the present invention will be more clearly understood from the following description taken in conjunction with the accompanying drawings in which.

DESCRIPTION OF THE PREFERRED EMBODIMENTS

First Embodiment

Figure 2:
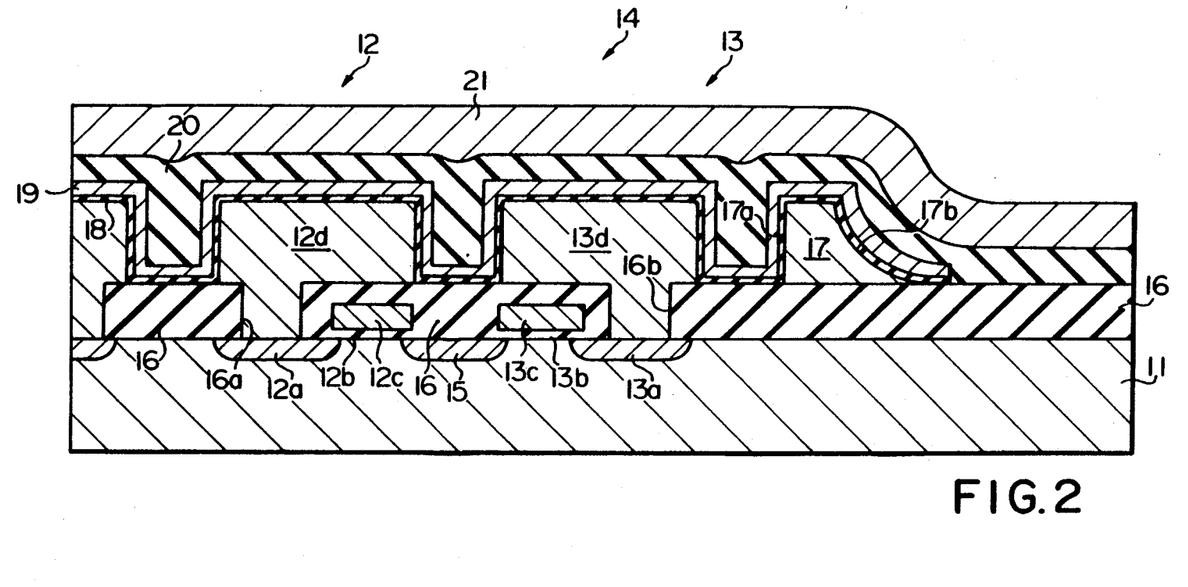
FIG. 2 is a cross sectional view showing the structure of a random access memory device according to the present invention.
Figure 3:
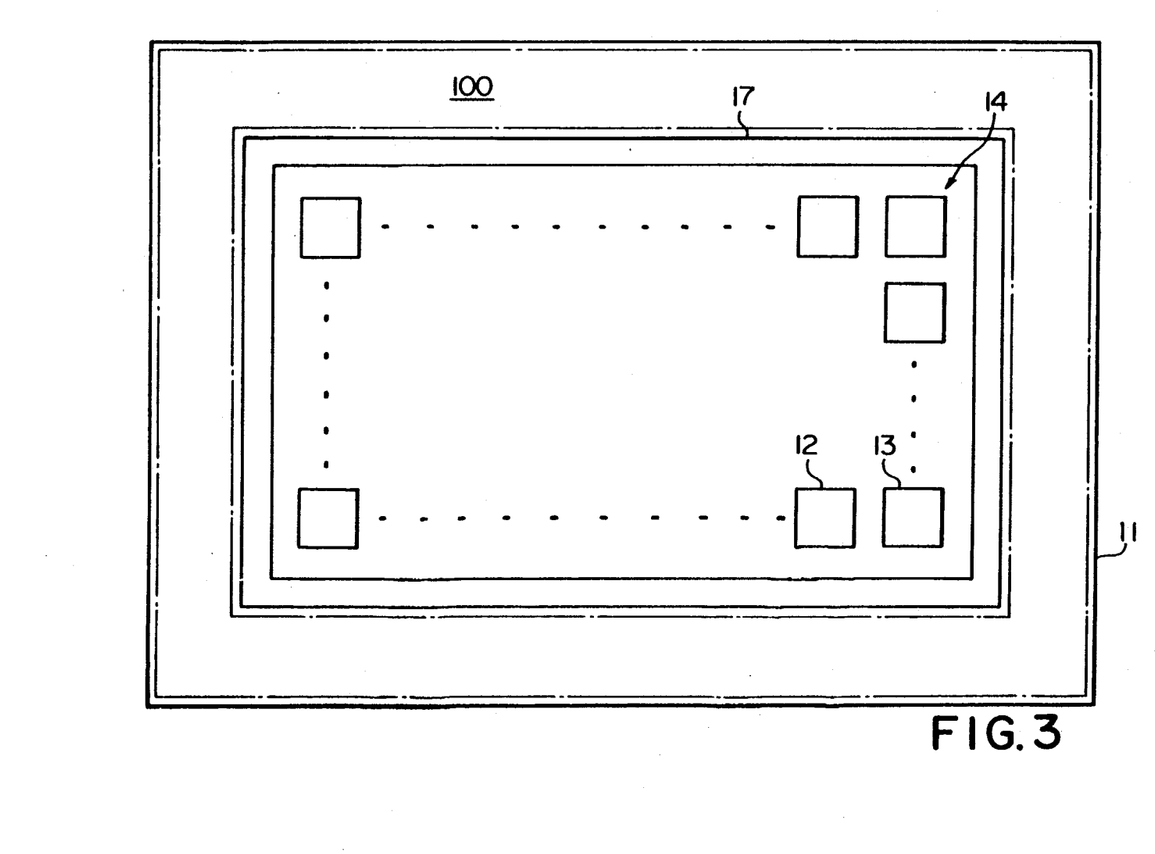
FIG. 3 is a plan view showing the layout of the random access memory device shown in FIG. 2.

Referring first to FIG. 2 of the drawings, a random access memory device embodying the present invention is fabricated on a p-type single crystalline silicon substrate 11 and has two stacked memory cells 12 and 13. The random access memory device has a memory cell array 14 consisting of a plurality of stacked memory cells as shown in FIG. 3, but only stacked two memory cells 12 and 13 are described in detail. Peripheral circuits 100 such as, for example, address decoders are located outside the memory cell array 4, and a large number of wirings propagate various signals therebetween.

In the surface portion of the silicon substrate 11 is formed an elongated impurity region which serves as a bit line 15 and is shared between two columns of the stacked memory cells. The stacked memory cells 12 and 13 belong to the two columns, respectively. Two impurity regions are further formed in the surface portion and spaced from the bit line 15. The two impurity regions provides memory nodes 12a and 13a for the stacked memory cells 12 and 13, and the elongated impurity region and the two impurity regions are opposite in conductivity type to the silicon substrate 11. A thin silicon oxide film is grown over that area between the bit line 15 and the memory node 12a, and the thin silicon oxide film serves as a gate insulating film 12b. A gate electrode 12c is provided on the gate insulating film 12b and forms a switching transistor of the stacked memory cell 12 together with the gate insulating film 12b and the memory node 12a. In a similar manner, a thin silicon oxide film is grown over that area between the bit line 15 and the memory node 13a, and a gate electrode 13c is provided on the thin silicon oxide film serving as a gate insulating film 13b. The memory node 13a, the gate insulating film 13b and the gate electrode 13c as a whole constitute a switching transistor of the stacked memory cell 13.

The gate electrodes 12c and 13c and the exposed surface portion of the silicon substrate 11 are covered with a thick silicon oxide film which not only laterally isolates the columns including the stacked memory cells 12 and 13 from other columns but also vertically isolates the gate electrodes 12c and 13c from storage capacitors of the stacked memory cells 12 and 13. The thick silicon oxide film serves as a lower inter-level insulating layer 16. Contact holes 16a and 16b are formed in the lower inter-level insulating layer 16, exposing the memory nodes 12a and 13a, respectively. On the lower inter-level insulating layer 16 is formed lower electrodes 12d and 13d which respectively pass through the contact holes 16a and 16b so as to be brought into contact with the memory nodes 12a and 13a, respectively. In this instance, the lower electrodes 12d and 13d are formed of polysilicon.

On the lower inter-level insulating layer 16 is further formed a rampart structure 17 which is formed of polysilicon and surrounds the memory cell array 14 as will be better seen from FIG. 3. The rampart structure 17 has a steep inner wall 17a, but an outer wall 17b of the rampart structure 17 gently sloping down to the lower inter-level insulating layer 16. The peripheral circuits 100 are disposed outside the outer wall 17b of the rampart structure 17. The lower electrodes 12d and 13d and the rampart structure 17 is covered with a thin dielectric film structure 18 which conformably extends over the memory cell array 4 and the rampart structure 17. In this instance, only a single silicon nitride film forms the thin dielectric film structure 18. However, the thin dielectric film structure 18 may be of a composite film structure of a silicon oxide film and a silicon nitride film. The thin dielectric film structure 18 is overlain by an upper electrode of polysilicon which is shared between the storage capacitors of the memory cell array 4. An upper interlevel insulating layer 20 covers the entire surface of the structure, and an upper metal wiring layer 21 extends on the upper inter-level insulating layer 20.

In this instance, the lower electrodes 12d and 13d and the rampart structure 17 are about 1 micron in height, and the upper electrode 19 is about 0.2 micron thick. Since the thickness of the thin dielectric film structure 18 is negligible, the outer wall 17b goes down over about 1.2 micron Since the outer wall 17b provides a gentle sloop, the upper inter-level insulating layer 20 and the metal wiring layer 21 conformably extend, and no disconnection takes place even if the upper inter-level insulating layer 20 is not increased in thickness with respect to the insulating film 8 of the prior art random access memory device shown in FIG. 1.

Figure 4A:
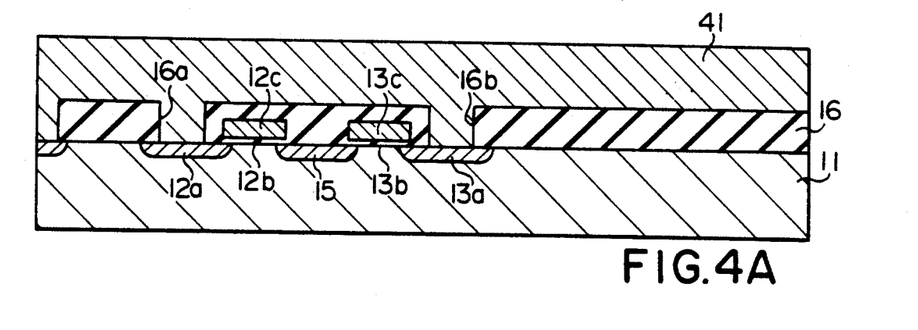
FIGS. 4A to 4E are cross sectional views showing a process sequence for fabricating the random access memory device shown in FIG. 2.

Description is hereinbelow made on a process sequence for fabricating the random access memory device shown in FIG. 2. The process sequence starts with the p-type single silicon substrate 11, and a field oxide layer is grown on the silicon substrate 11, defining an active region where component transistors are formed. The gate insulating films 12b and 13b are thermally grown in the active region, and the gate electrodes 12c and 13c are patterned through a lithographic process. The gate electrodes 12c and 13c provide mask layers, and n-type impurity atoms are, then, ion implanted into the surface portion of the silicon substrate 11. Then, the bit line 15 and the memory nodes 12a and 13a are formed in the surface portion of the silicon substrate 11. A silicon oxide is deposited on the entire surface of the structure, and the silicon oxide film thus deposited forms the lower inter-level insulating layer 16 together with the field oxide film previously grown. An appropriate photomask is applied to the lower inter-level insulating layer 16, and contact holes 16a and 16b are formed in the lower inter-level insulating layer 16. The contact holes 16a and 16b expose the memory nodes 12a and 12b, respectively. A polysilicon film 41 is deposited on the entire surface of the structure, and the polysilicon film 41 penetrates the contact holes 16a and 16b, thereby being brought into contact with the memory nodes 12a and 12b as shown in FIG. 4A. N-type impurity atoms are doped into the polysilicon film 41 for high conductivity.

Figure 4B:
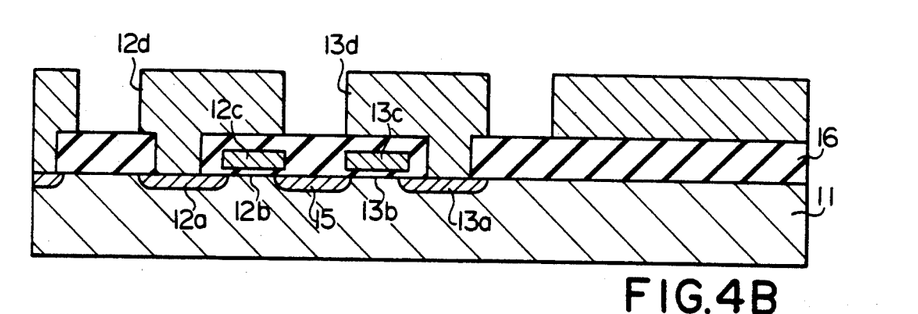

A photomask layer is applied on the polysilicon film 41, and the polysilicon film 41 is unisotropically etched so that the lower electrodes 12d and 13d are patterned as shown in FIG. 4B. However, the polysilicon film 41 outside the memory cell array 14 is left on the lower inter-level insulating layer 16. In this instance, a gap between the adjacent two lower electrodes 12d and 13d is of the order of 1 micron, and the gap between the lower electrode 13d and the rampart structure 17 is also 1 micron.

Figure 4C:
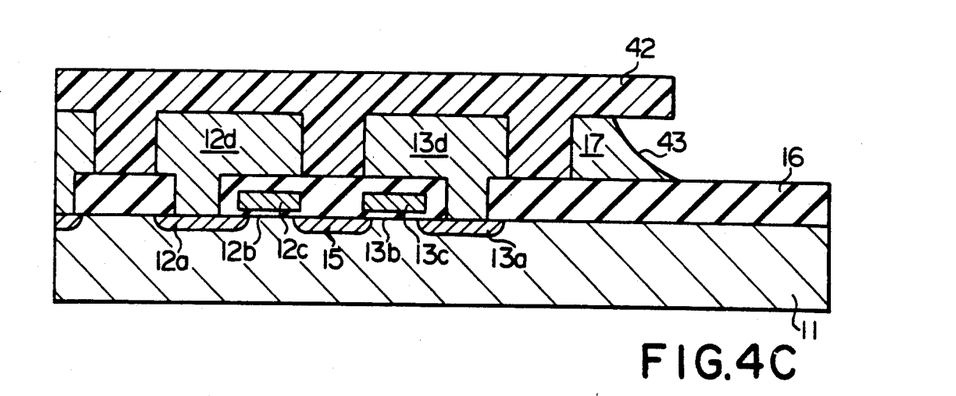

A photoresist solution is spun onto the entire surface of the structure, and the photoresist film is patterned through a lithographic process, and the lower electrodes 12d and 13d are perfectly covered with the photoresist mask 42. A part of the polysilicon film 41 is further covered with the photoresist mask 42, but the other polysilicon film 41 is exposed. The exposed polysilicon film 41 is isotropically etched away, and a gentle slope 43 is created in the part of the polysilicon film 41 as shown in FIG. 4C. The gentle slope 43 serves as the outer wall 17b of the rampart structure 17.

Figure 4D:
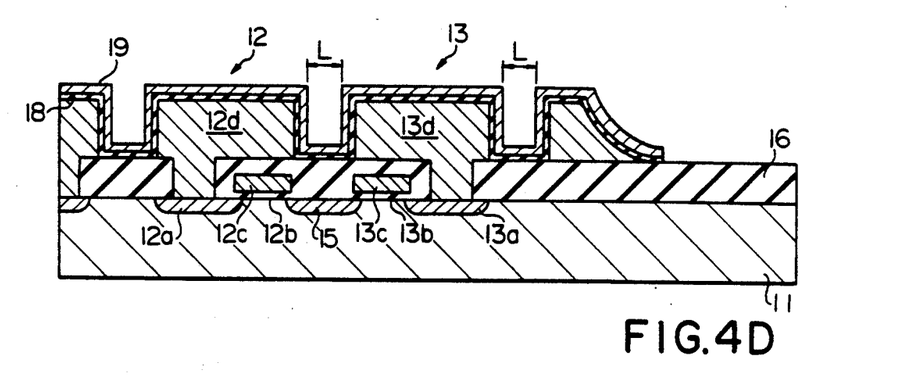

A silicon nitride film is deposited to about 100 angstroms, and a polysilicon film is further deposited to about 0.2 micron on the silicon nitride film. N-type impurity atoms are doped into the polysilicon film, and the polysilicon film and the silicon nitride film are patterned so that the dielectric film structure 18 and the upper electrode 19 are formed as shown in FIG. 4D. The dielectric film structure 18 and the upper electrode 19 are conformal, and, for this reason, a gap L between the lower electrodes 12 and 13 as well as a gap L between the lower electrode 13 and the rampart structure 17 are decreased to about 0.6 micron.

Figure 4E:
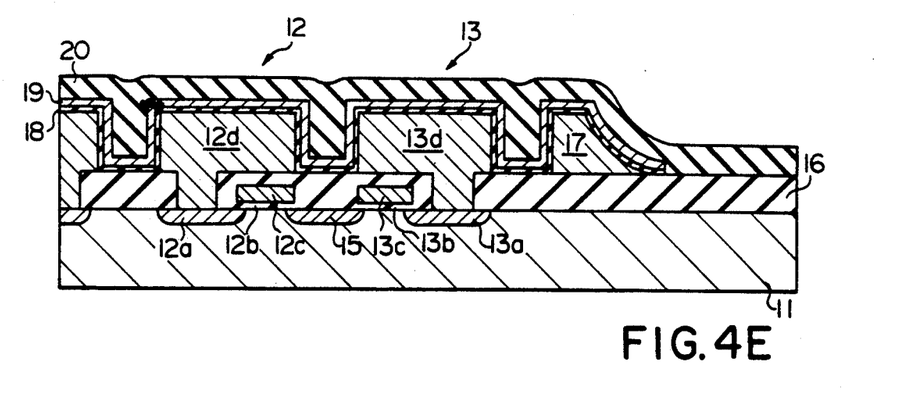

A phosphosilicate glass film is, then, deposited to about 0.4 micron on the entire surface of the structure, and the phosphosilicate glass film is placed in a high temperature ambience ranging from about 900 degrees to 950 degrees in centigrade. The phosphosilicate glass reflows, and the gap L is filled with the phosphosilicate glass as shown in FIG. 4E. The phosphosilicate glass film serves as the upper inter-level insulating layer 20. Although not shown in the drawings, contact holes are formed through the upper inter-level insulating layer 20, and metal wiring layers including the layer 21 are deposited and patterned on the upper inter-level insulating layer 20, thereby completing the structure shown in FIG. 2. Since the rampart structure 17 has the gentle outer wall 17b, the metal wiring layer 21 is substantially conformal without increasing the thickness of the upper inter-level insulating layer 20, and, for this reason, any disconnection is hardly takes place in the metal wiring layer 21.

Second Embodiment

Figure 5:
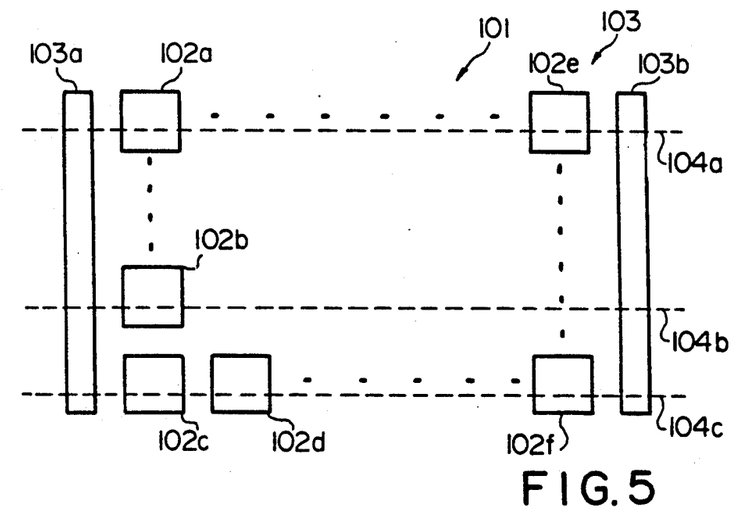
FIG. 5 is a plan view showing the layout of another random access memory device according to the present invention.

Turning to FIG. 5 of the drawings, another random access memory device embodying the present invention is illustrated and comprises a memory cell array 101 having a plurality of stacked memory cells 102a, 102b, 102c, 102d, 102e and 102f arranged in rows and columns. A rampart structure is constituted by two ramparts 103a and 103b, and the ramparts 103a and 103b extend along the leftmost and rightmost columns of the memory cells, respectively. A plurality of metal wiring layers 104a, 104b and 104c laterally extend over the memory cell array 101 and the ramparts 103a and 103b. If the wiring layers 104a to 104c extend in the lateral direction only, no rampart is necessary along the front and rear ends of the memory cell array 101.

Third Embodiment

Figure 6:
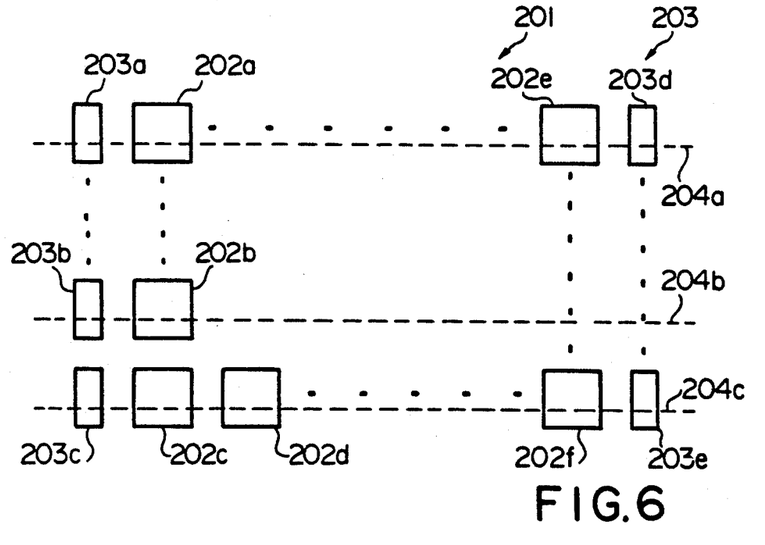
FIG. 6 is a plan view showing the layout of still another random access memory device according to the present invention.

Turning to FIG. 6 of the drawings, another random access memory device embodying the present invention is illustrated and comprises a memory cell array 201 having a plurality of stacked memory cells 202a, 202b, 202c, 202d, 202e and 202f arranged in rows and columns. A rampart structure is formed outside the memory cell array 201 and has a plurality of ramparts 203a, 203b, 203c, 203d and 203e. The ramparts 203a to 203c arranged in column and constitute a first group along the leftmost column of the memory cell array 101. On the other hand, ramparts 203d to 203e belong to a second group and are located along the right side of the memory cell array 201. The component ramparts 203a to 203c or 203d to 203e of each group is spaced from one another, however, those ramparts are surely located below the wiring layers 204a to 204c.

As will be understood from the foregoing description, the random access memory device according to the present invention is free from non-conformal wiring layer and from undesirable disconnection. This results in improvement in production yield of the random access memory device.

Although particular embodiments of the present invention have been shown and described, it will be obvious to those skilled in the art that various changes and modifications may be made without departing from the spirit and scope of the present invention. For example, the silicon substrate may be shared between the random access memory device and other semiconductor devices such as, for example, a logic circuit. Moreover, in the above described embodiment, the predetermined cell area is located in a central area of the major surface of the silicon substrate. However, the predetermined cell area may be in a part of the peripheral area of the silicon substrate. The above mentioned random access memory cells are of the stacked memory cell, however, the rampart structure is effective against any non-conformal layer and applicable to another type of memory cell.

What is claimed is:

1. A semiconductor memory device fabricated on a semiconductor substrate having a predetermined cell area, comprising:
   a) a memory cell array having a plurality of memory cells and located in said predetermined cell area;
   b) a rampart structure formed outside said memory cell array and having an outer wall gently sloping down;
   c) an upper insulating layer covering said memory cells and said rampart structure; and
   d) at least one wiring layer formed on said upper insulating layer and extending over at least one of said memory cells and said rampart structure.

2. A semiconductor memory device as set forth in claim 1, in which said rampart structure surrounds said memory cell array.

3. A semiconductor memory device as set forth in claim 2, in which said memory cells are of a stacked memory cell having a switching transistor covered with a lower insulating layer and a storage capacitor formed on said lower insulating layer, said storage capacitor having a lower electrode in contact with a memory node, a dielectric film structure covering said lower electrode and an upper electrode formed on said dielectric film structure.

4. A semiconductor memory device as set forth in claim 3, in which said storage capacitor is as high as said rampart structure.

5. A semiconductor memory device as set forth in claim 1, in which said rampart structure comprises a first rampart disposed along the left side of said memory cell array.

6. A semiconductor memory device as set forth in claim 5, in which said rampart structure further comprises a second rampart disposed along the right side of said memory cell array.

7. A semiconductor memory device as set forth in claim 6, in which said memory cells are of a stacked memory cell having a switching transistor covered with a lower insulating layer and a storage capacitor formed on said lower insulating layer.

8. A semiconductor memory device as set forth in claim 1, in which said rampart structure comprises a first group of ramparts formed at spacings along the left side of said memory cell array.

9. A semiconductor memory device as set forth in claim 8, in which said rampart structure further comprises a second group of ramparts formed at spacings along the right side of said memory cell array.

10. A semiconductor memory device as set forth in claim 9, in which said memory cells are of a stacked memory cell having a switching transistor covered with a lower insulating layer and a storage capacitor formed on said lower insulating layer.

11. A semiconductor memory device as set forth in claim 10, in which said semiconductor device further has a plurality of wiring layers formed on said upper insulating layer and in which said wiring layers respectively extend over said ramparts.

* * * * *